(12) United States Patent
Baek et al.

(10) Patent No.: US 9,646,895 B2
(45) Date of Patent: May 9, 2017

(54) SEMICONDUCTOR PACKAGE AND MANUFACTURING METHOD THEREOF

(71) Applicant: Samsung Electronics Co., Ltd., Suwon-si, Gyeonggi-do (KR)

(72) Inventors: Seungduk Baek, Hwaseong-si (KR); Ji Hwang Kim, Cheonan-si (KR); Taeje Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/714,667

(22) Filed: May 18, 2015

(65) Prior Publication Data

US 2016/0093541 A1  Mar. 31, 2016

(30) Foreign Application Priority Data

Sep. 30, 2014 (KR) .......................... 10-2014-0131591

(51) Int. Cl.

| | |
|---|---|
| *H01L 21/66* | (2006.01) |
| *G01R 31/26* | (2014.01) |
| *H01L 23/00* | (2006.01) |
| *H01L 23/525* | (2006.01) |

(52) U.S. Cl.
CPC .......... *H01L 22/14* (2013.01); *G01R 31/2601* (2013.01); *H01L 22/32* (2013.01); *H01L 24/06* (2013.01); *H01L 23/5256* (2013.01); *H01L 2224/05554* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01)

(58) Field of Classification Search
CPC ...... H01L 22/34; H01L 22/14; G01R 31/2642
See application file for complete search history.

(56) References Cited

U.S. PATENT DOCUMENTS

| | | | |
|---|---|---|---|
| 4,583,109 A | 4/1986 | Goetz | |
| 7,307,441 B2* | 12/2007 | Sohn | ........ H01L 22/32 257/48 |
| 7,545,473 B2 | 6/2009 | Ueda et al. | |
| 7,901,958 B2 | 3/2011 | Okamoto et al. | |
| 8,648,341 B2 | 2/2014 | Yang et al. | |
| 8,853,867 B2 | 10/2014 | Chopin et al. | |

(Continued)

FOREIGN PATENT DOCUMENTS

| | | |
|---|---|---|
| JP | 2008-298630 A | 12/2008 |
| KR | 10-2000-0074283 A | 12/2000 |
| KR | 10-2002-0021722 A | 3/2002 |

*Primary Examiner* — Michael Carter
(74) *Attorney, Agent, or Firm* — Harness, Dickey & Pierce, P.L.C.

(57) ABSTRACT

A method of manufacturing a semiconductor package includes providing a semiconductor chip including a circuit pattern, a connection pad, a first test pad and a second test pad, each of the connection pad, the first test pad and the second test pad respectively electrically connected to the circuit pattern, evaluating electrical characteristics of the semiconductor chip by applying a first test voltage to the first test pad and a second test voltage to the second test pad, the second test voltage being higher than the first test voltage, and electrically disconnecting the second test pad from the circuit pattern.

2 Claims, 15 Drawing Sheets

(56) References Cited

U.S. PATENT DOCUMENTS

| | | | |
|---|---|---|---|
| 2003/0062521 A1* | 4/2003 | Jang | H01L 22/34 257/48 |
| 2006/0076972 A1* | 4/2006 | Walker | G01R 31/2642 324/762.09 |
| 2006/0141654 A1 | 6/2006 | Lim | |
| 2006/0261473 A1* | 11/2006 | Connah | H01L 23/15 257/728 |
| 2008/0180126 A1* | 7/2008 | Okayasu | H01L 21/76254 324/750.15 |
| 2008/0272893 A1 | 11/2008 | Hilgers | |
| 2011/0128032 A1 | 6/2011 | Watanabe et al. | |

* cited by examiner

SEMICONDUCTOR PACKAGE AND MANUFACTURING METHOD THEREOF

CROSS-REFERENCE TO RELATED APPLICATIONS

This U.S. non-provisional patent application claims priority under 35 U.S.C. §119 of Korean Patent Application No. 10-2014-0131591, filed on Sep. 30, 2014, the entire contents of which are hereby incorporated by reference.

BACKGROUND

1. Field

Some example embodiments relate to a semiconductor, and more particularly, to a semiconductor package having pads and a manufacturing method thereof.

2. Description of the Related Art

With the development of electronic industries, semiconductor devices tend to have light weight, small size, high speed operation, and high performance. As signal processing speed of semiconductor devices is improved, differences in electrical property and characteristics between high speed semiconductor chips formed from one wafer may be more than between low speed semiconductor chips. Accordingly, even though semiconductor chips are manufactured from the same wafer, electrical properties and characteristics are needed to be checked for each semiconductor chip.

SUMMARY

Some example embodiments provide a semiconductor package having reliability by preventing or reducing corrosion of a semiconductor chip, and a manufacturing method thereof.

According to an example embodiment of the inventive concepts, a method of manufacturing a semiconductor package includes providing a semiconductor chip having a circuit pattern, a connection pad a first test pad and a second test pad, each of the connection pad, the first test pad and the second test pad respectively electrically connected to the circuit pattern, evaluating electrical characteristics of the semiconductor chip by applying a first test voltage to the first test pad and a second test voltage to the second test pad, the first test voltage being higher than the second test voltage, and electrically disconnecting the second test pad from the circuit pattern.

In an example embodiment, the method may further include mounting the semiconductor chip on a substrate, wherein the substrate may be electrically connected to the connection pad and electrically disconnected from the first and second test pads.

In an example embodiment, the first test voltage may be applied to the first test pad at a higher voltage than a voltage of the connection pad.

In an example embodiment, the second test voltage may be applied to the second test pad at a lower voltage than the voltage of the connection pad.

In an example embodiment, the connection pad may be a plurality of connection pads, the first test pad may be a plurality of first test pads and the second test pad may be a plurality of second test pads, and the number of the plurality of connection pads is greater than a sum of the numbers of the first and second test pads.

In an example embodiment, electrically disconnecting the second test pad from the semiconductor chip may include physically disconnecting the second test pad from the semiconductor chip using a fuse.

In an example embodiment, the second test pad may be electrically disconnected from the semiconductor chip by a switching device between the circuit pattern and the second test pad.

In an example embodiment, providing the semiconductor chip may include forming a conductive layer on one surface of the substrate, and patterning the conductive layer to form the connection pad, the first test pad and the second test pad.

According to another example embodiment of the inventive concepts, a method of manufacturing a semiconductor package includes providing a semiconductor chip having a connection pad, a first test pad and a second test pad, evaluating electrical characteristics of the semiconductor chip by applying a first test voltage to the first test pad and a second test voltage to the second test pad, after evaluating the electrical characteristics of the semiconductor chip, electrically disconnecting the second test pad from the semiconductor chip, and mounting the semiconductor chip on a substrate electrically connected to the connection pad and electrically disconnected from the first test pad and the second test pad.

In another example embodiment, the first test voltage may be applied at a higher voltage than a voltage of the connection pad.

In another example embodiment, the second test voltage may be applied at a lower voltage than the voltage of the connection pad.

In another example embodiment, the first test voltage may be higher than the second test voltage.

In another example embodiment, the semiconductor chip may further include a circuit pattern electrically connected to the connection pad, a first switching device between the circuit pattern and the first test pad, and a second switching device between the circuit pattern and the second test pad, wherein the second test pad may be disconnected from the semiconductor chip using the second switching device.

In another example embodiment, the method may further include evaluating reliability of the semiconductor chip before evaluating the electrical characteristics of the semiconductor chip, wherein the reliability of the semiconductor chip may be evaluated when the first and second test pads are electrically disconnected from the circuit pattern.

In another example embodiment, the method may further include electrically connecting the first and second test pads to the circuit pattern using the first and second switching devices before evaluating the electrical characteristics of the semiconductor chip, wherein the first and second test pads may be electrically connected to the circuit pattern after evaluating the reliability of the semiconductor chip.

According to yet another example embodiment of the inventive concepts, a method of manufacturing a semiconductor package includes providing a semiconductor chip including a plurality of connection pads, a plurality of first test pads and a plurality of second test pads, respectively, wherein a number of the connection pads is greater than a sum of the numbers of the first test pads and the second test pads, evaluating electrical characteristics of the semiconductor chip by applying a first test voltage to the first test pads and a second test voltage to the second test pads, and after the evaluating, electrically disconnecting the second test pads from the semiconductor chip.

In yet another example embodiment, the second test voltage may be applied to the second test pads at a higher voltage than a voltage of the connection pads.

In yet another example embodiment, the first test voltage may be applied to the first test pads at a smaller voltage than the voltage of the connection pads.

In yet another example embodiment, the second test voltage may be higher than the first test voltage.

In yet another example embodiment, the semiconductor chip may further include a circuit pattern electrically connected to the connection pads, a first switching device between the circuit pattern and the first test pads, and a second switching device between the circuit pattern and the second test pads, wherein the second test pads may be electrically disconnected from the semiconductor chip using the second switching device.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings:

FIGS. 1A to 3A, and FIG. 6A are plan views illustrating a manufacturing method of a semiconductor package according to an example embodiment of the inventive concepts;

FIGS. 1B to 3B, and FIG. 6B are cross-sectional views taken along line A-B of FIGS. 1A to 3A, and FIG. 6A;

FIG. 2C to FIG. 3C, and FIG. 6C are enlarged views of Y regions of FIGS. 2B to 3B, and FIG. 6B;

DETAILED DESCRIPTION

Figure 1A:
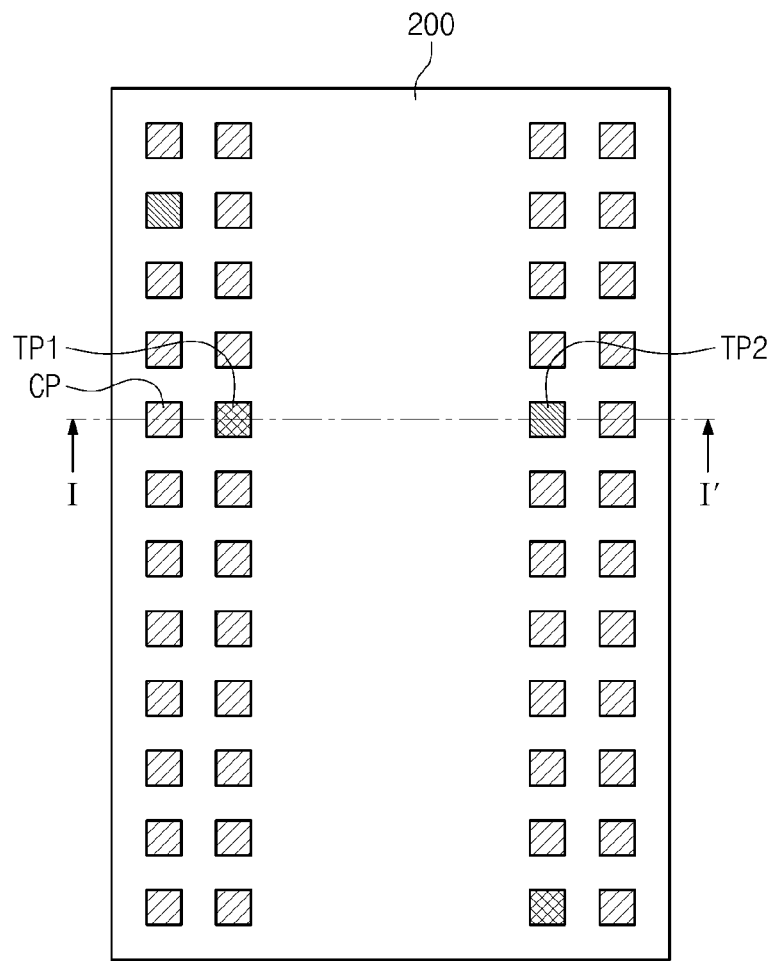

Example embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

The terms and words used in the following description and claims are to describe embodiments but are not limited the inventive concepts. As used herein, the singular forms "a," "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements.

When a film (or layer) is referred to as being 'on' another film (or layer) or substrate, it can be directly on the other film (or layer) or substrate, or intervening films (or layers) may also be present.

Although the terms first, second, third etc. may be used herein to describe various regions, and films (or layers) etc., the regions and films (or layers) are not to be limited by the terms. The terms may be used herein only to distinguish one region or film (or layer) from another region or film (or layer). Therefore, a layer referred to as a first film in one embodiment can be referred to as a second film in another embodiment. An embodiment described and exemplified herein includes a complementary embodiment thereof. Like reference numerals refer to like elements throughout.

Unless otherwise defined, all terms used herein have the same meaning as commonly understood by one of ordinary skill in the art to which the inventive concepts pertain.

Hereinafter, a manufacturing method of a semiconductor package according to an example embodiment of the inventive concepts will be described.

FIGS. 1A to 3A, and FIG. 6A are plan views illustrating a manufacturing method of a semiconductor package according to an example embodiment of the inventive concepts. FIGS. 1B to 3B, and FIG. 6B are cross-sectional views taken along line A-B of FIGS. 1A to 3A, and FIG. 6A. FIG. 2C to FIG. 3C, and FIG. 6C are respectively enlarged views of Y regions of FIGS. 2B to 3B, and FIG. 6B.

Figure 1B:
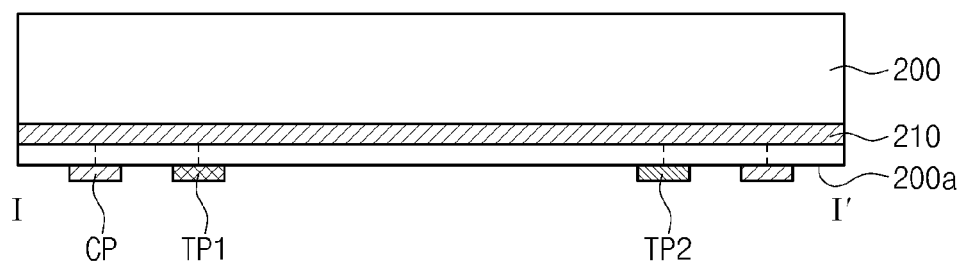

Referring to FIGS. 1A and 1B, a semiconductor chip 200 may be provided which includes a circuit pattern 210, connection pads CP, a first test pad TP1, and a second test pad TP2. The semiconductor chip 200 may be provided as a wafer level or a chip level. The circuit pattern 210 may be disposed adjacent to one surface 200a of the semiconductor chip 200. The circuit pattern 210 may include integrated circuits and interconnections provided inside an insulating film. The connection pads CP may be disposed on the one surface 200a of the semiconductor chip 200. The connection pads CP may include a power supplying connection pad, a ground connection pad, and a signal delivery connection pad. As illustrated with a dotted line in FIG. 1B, the connection pads CP may be electrically connected to the circuit pattern 210.

Hereinafter, the dotted lines in FIGS. 1B, 2B, 3B, 6B, and 6D indicate electrical connections.

The first and second test pads TP1 and TP2 may be laterally separated from the connection pads CP on the one surface 200a of the semiconductor chip 200. As illustrated in FIG. 1A, a sum of the numbers of the first test pads TP1 and the second test pads TP2 may be smaller than the number of the connection pads CP. As illustrated with a dotted line in FIG. 1B, the first and second test pads TP1 and TP2 may be electrically connected to the circuit pattern 210.

The connection pads CP, the first test pads TP1, and the second test pads TP2 may be formed by an identical process. For example, a conduction layer (not shown) may be formed on the one surface 200a of the semiconductor chip 200. The connection pads CP, the first test pads TP1, and the second test pads TP2 may be formed by patterning the conductive layer. Accordingly, the connection pads CP, the first test pads TP1, and the second test pads TP2 may include an identical material. For example, the connection pads CP, the first test pads TP1, and the second test pads TP2 may include a metal material such as aluminum. A thickness of each of the connection pads CP may be substantially the same as those of the first test pads TP1 and the second test pads TP2. Here, the term "substantially the same" includes an error range that may occur in a deposition process of the same conductive layer.

The connection pads CP and the first and second test pads TP1 and TP2 may have the same or similar shape. However, formation processes, materials, thicknesses, and shapes of the connection pads CP and the first and second test pads TP1 and TP2 are not limited hereto and may be changed.

Figure 2A:
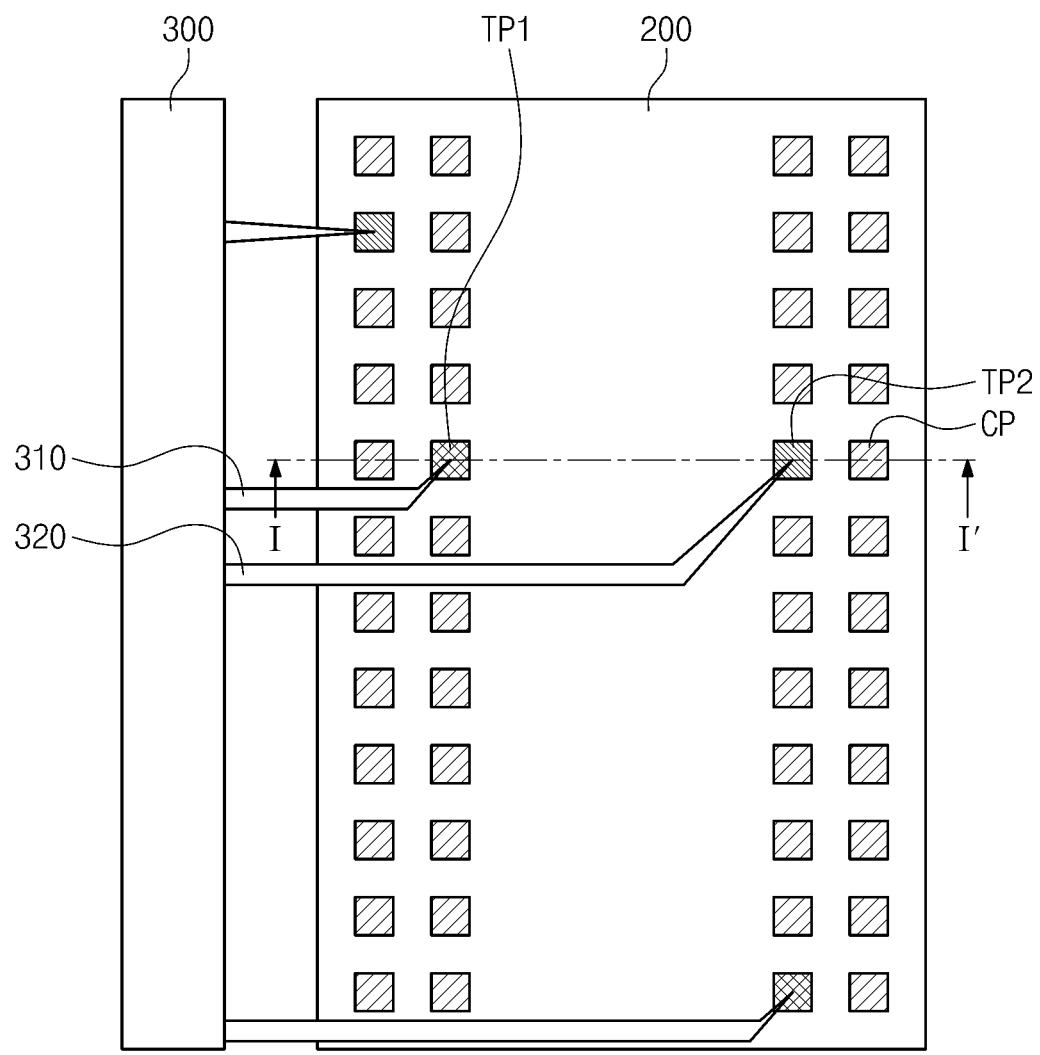
Figure 2B:
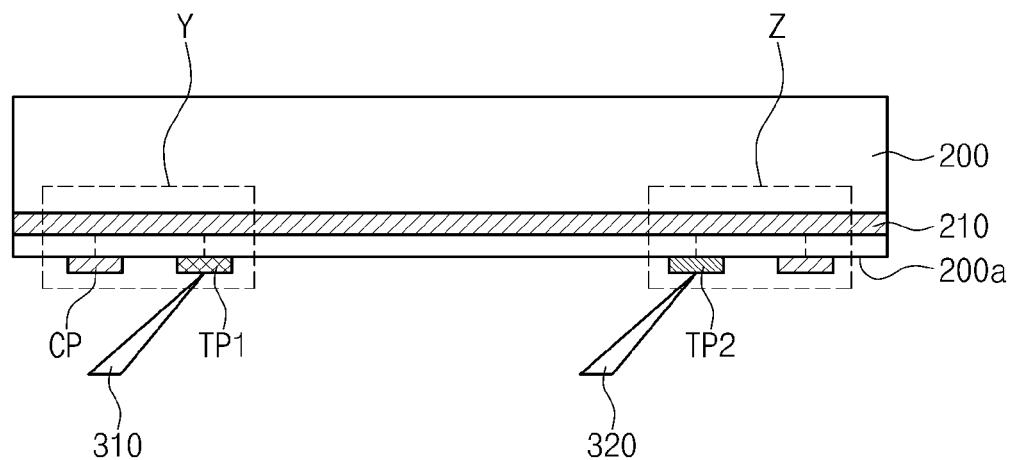
Figure 2C:
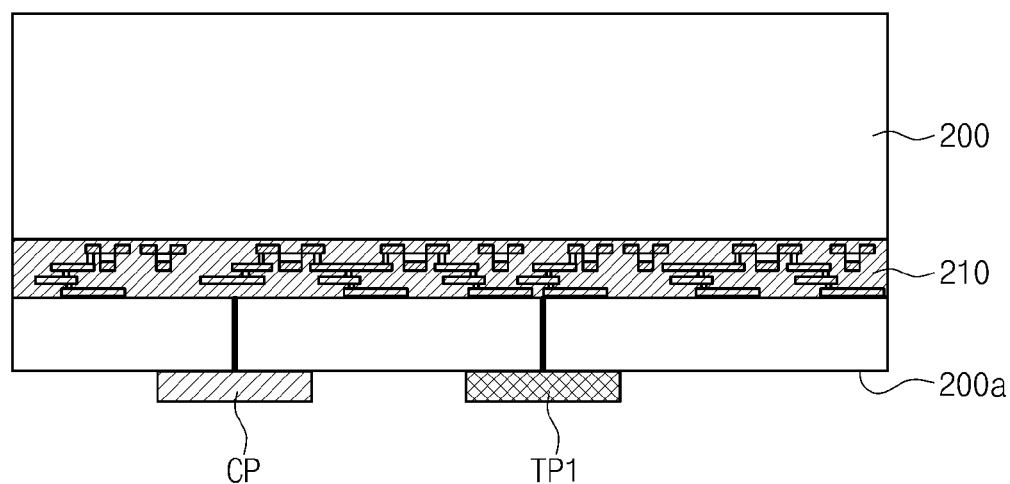

Referring FIGS. 2A to 2C, electrical characteristics of the semiconductor chip 200 may be evaluated by using a test device 300. The electrical characteristic evaluation may be an electrical die sorting (EDS) test. For example, in the process of the electrical characteristic evaluation of the semiconductor chip 200, first and second test voltages may be respectively applied to the first and second test pads TP1 and TP2. The first test voltage may be higher than the second test voltage. The first and second test voltages may be DC bias voltages. The first test voltage may be higher than voltages applied to the connection pads CP. For example, the first test voltage may be higher than a maximum value of voltages applied to the connection pads CP.

The second test voltage may be smaller than the voltages applied to the connection pads CP. The test device 300 may include a first probe 310 and a second probe 320. The first probe 310 may contact the first test pads TP1 to measure a first test voltage. The second probe 320 may contact the second test pads TP2 to measure a second test voltage. The test device 300 may analyze the measured first and second test voltages and evaluate electrical characteristics of the semiconductor chip 200.

Before the evaluation of the electrical characteristics of the semiconductor chip 200, a reliability evaluation test of the semiconductor chip 200 may be performed. For example, the reliability evaluation test of the semiconductor chip 200 may include a temperature humidity bias (THB) test, a highly accelerated stress test, a high temperature storage (HTB) test, or a pre-conditioning test.

Figure 3A:
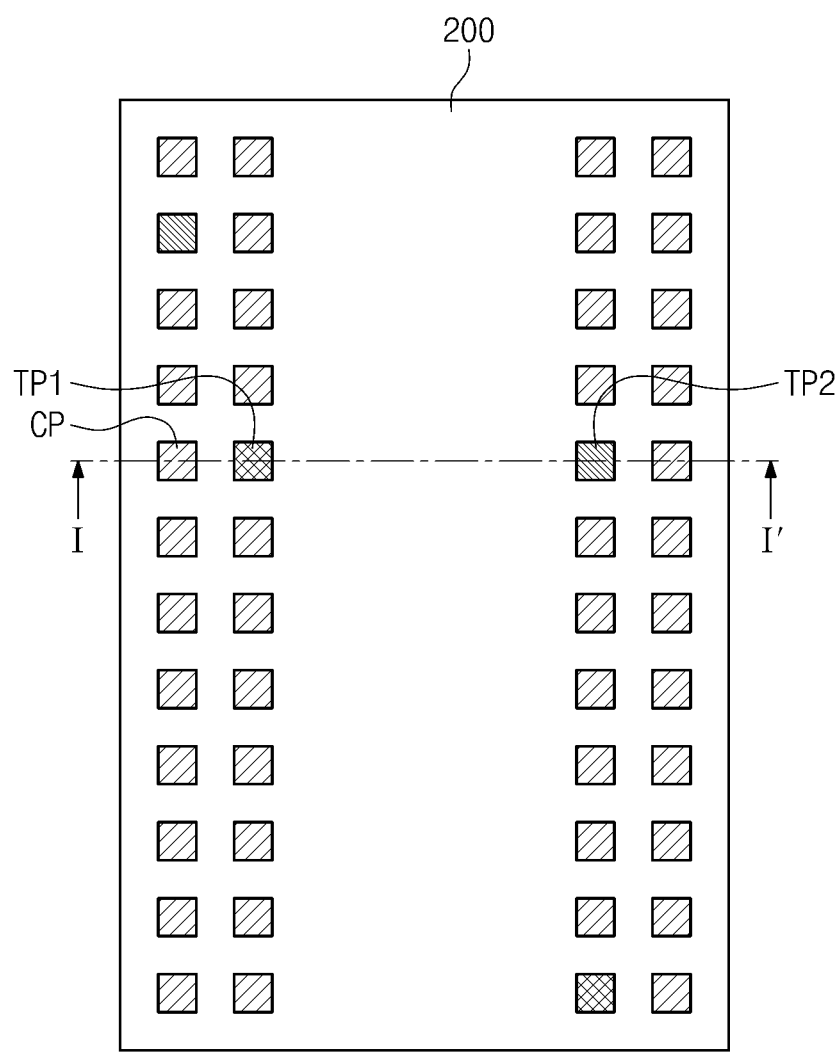
Figure 3B:
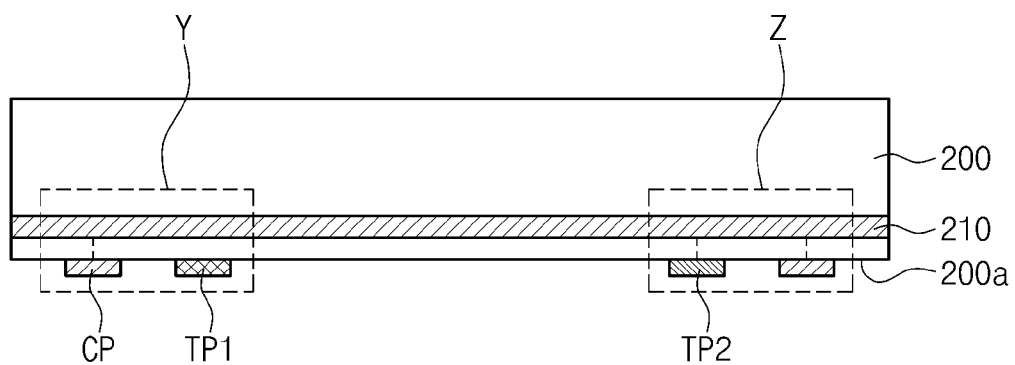
Figure 3C:
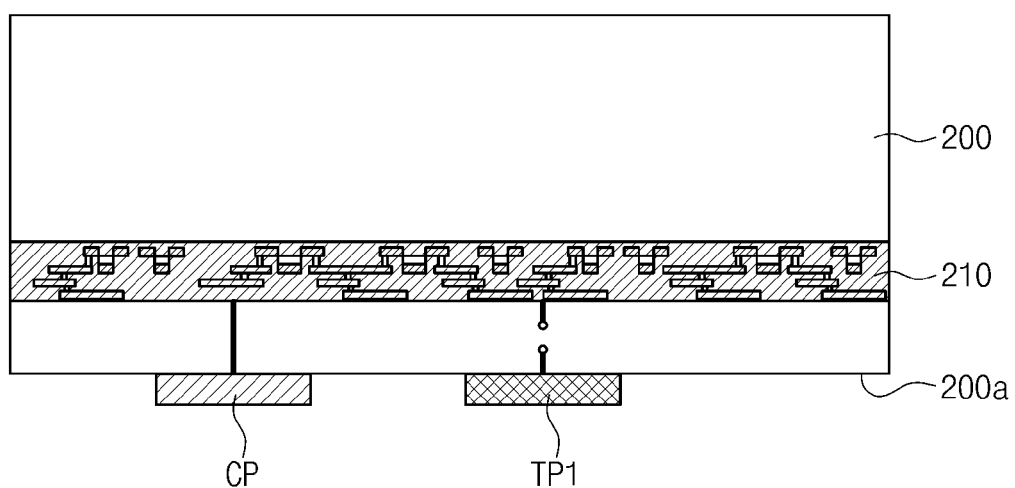

Referring to FIGS. 3A to 3C, the first test pads TP1 may be electrically disconnected from the circuit pattern 210 of the semiconductor chip 200. The electrical disconnection of the first test pads TP1 may be performed after the electrical characteristic evaluation of the semiconductor chip 200 is completed. At this point, the second test pads TP2 may be electrically connected to the circuit pattern 210. As another example, the second test pads TP2 may be electrically disconnected from the circuit pattern 210 by the same method as the first test pads TP1.

Hereinafter, electrical connections of the semiconductor chip in a manufacturing process of a semiconductor package will be described in detail. The description overlapping with the above description is omitted.

Figure 4A:
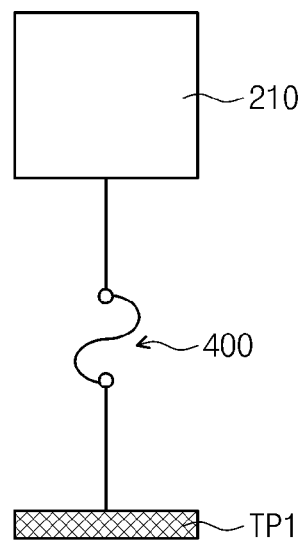
FIG. 4A illustrates a circuit diagram between a first test pad and a circuit pattern according to an example embodiment of the inventive concepts.

FIG. 4A is a circuit diagram between a first test pad and a circuit pattern according to an example embodiment of the inventive concepts.

Referring to FIG. 4A together with FIG. 2C, a fuse 400 may be connected to the first test pad TP1 and the circuit pattern 210 between the first test pad TP1 and the circuit pattern 210. For example, the fuse 400 may include a laser fuse or an electrical fuse. The fuse 400 may be respectively connected to the first test pad TP1 and the circuit pattern 210 in the operation of providing the semiconductor chip 200 as shown in FIGS. 1A and 1B, and in the electrical characteristic evaluation process of the semiconductor chip 200 described in relation to FIGS. 2A to 2C. Accordingly, the first test pad TP1 may be electrically and physically connected to the circuit pattern 210.

Referring to FIG. 4A together with FIG. 3C, when the electrical characteristic evaluation of the semiconductor chip 200 is completed, the fuse 400 is disconnected, so that the first test pad TP1 may be electrically and physically disconnected from the circuit pattern 210. At this point, the connection pads CP may be electrically connected to the circuit pattern 210. The second test pad TP2 may be electrically connected to the circuit pattern 210 as in FIG. 3B. For another example, the second test pad TP2 may be electrically disconnected from the circuit pattern 210.

Figure 4B:
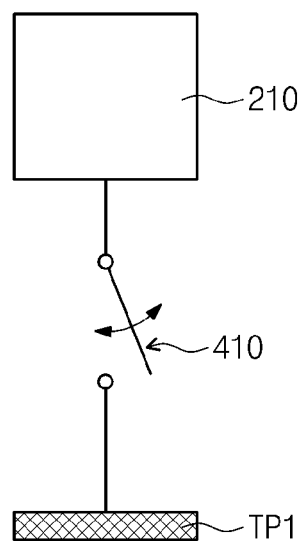
FIG. 4B illustrates a circuit diagram between a first test pad and a circuit pattern according to another example embodiment of the inventive concepts.

FIG. 4B illustrates a circuit diagram between a first test pad and a circuit pattern according to another example embodiment of the inventive concepts.

Referring FIG. 4B together with FIG. 2C, for example, a first switching device 410 may be provided between the first test pad TP1 and the circuit pattern 210. The first switching device 410 may include, but is not limited to, a multiplexer MUX, and may include various switching devices. The switching device 410 may be closed in the operation of providing the semiconductor chip 200 shown in FIGS. 1A and 1B, and in the electrical characteristic evaluation process of the semiconductor chip 200 described in relation to FIGS. 2A to 2C, and then the first test pad TP1 may be in a state of being electrically connected to the circuit pattern 210. At this point, in FIGS. 1B and 2B, the switching device may not be provided between the second test pas TP2 and the circuit pattern 210. According to an embodiment, when the switching device is omitted between the second test pad TP2 and the circuit pattern 210, the circuit pattern 210 between the second test pad TP2 and the circuit pattern 210 may have an improved layout freedom.

Referring FIG. 4B together with FIG. 3C, when the electrical characteristic evaluation for the semiconductor chip 200 is completed, the first switching device 410 may be opened. Accordingly, the first test pad TP1 may be electrically disconnected from the circuit pattern 210. As illustrated in FIG. 3B, the connection pad CP and the second test pad TP2 may be electrically connected to the circuit pattern 210.

Description is provided about the electrical connection of the semiconductor chip according to another embodiment. The description overlapping with the above description is omitted.

Figure 5A:
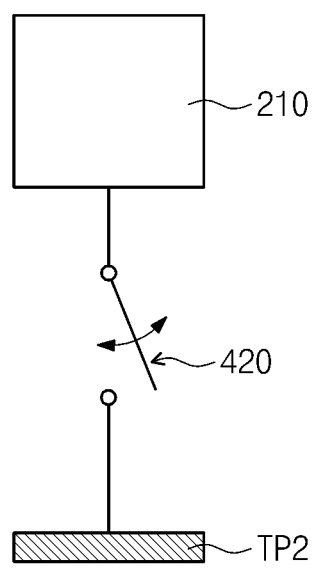
FIG. 5A is a circuit diagram between a second test pad and a circuit pattern according to an example embodiment of the inventive concepts.
Figure 5B:
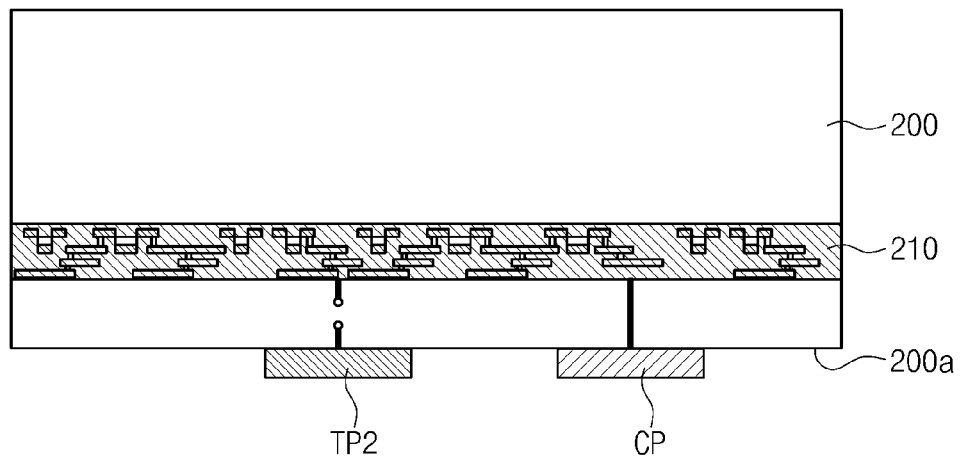
FIGS. 5B and 5C are enlarged views of Z regions in FIGS. 2B and 2C.
Figure 5C:
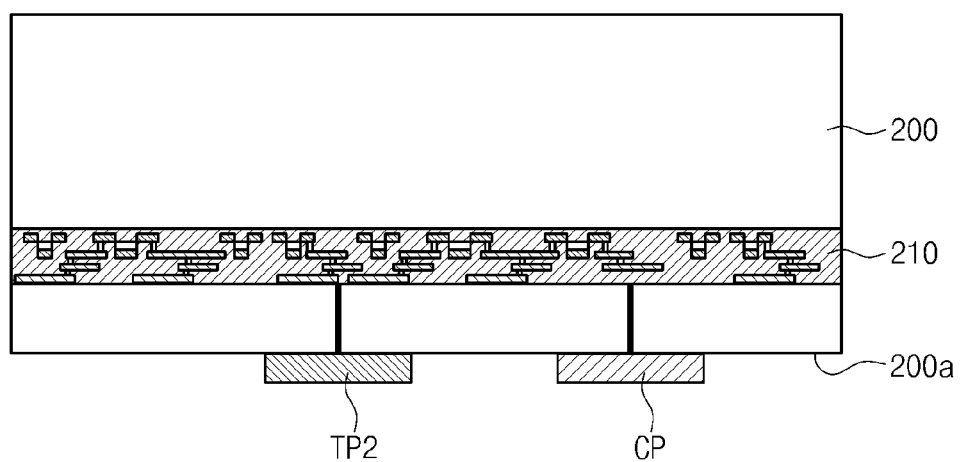

FIG. 5A is a circuit diagram between a second test pad and a circuit pattern according to an example embodiment of the inventive concepts. FIGS. 5B and 5C show example electrical connections of the second test pad in the manufacturing process of the semiconductor package, and are respectively enlarged views of Z regions of FIGS. 2B and 2C. Hereinafter, description is provided with reference to FIG. 4B.

Referring to FIGS. 5A and 5B, a second switching device 420 may be connected to the second test pad TP2 and the circuit pattern 210. In this case, the second switching device 420 may include, but is not limited to, a multiplexer MUX. The first switching device 410 may respectively connected to the first test pattern TP1 and the circuit pattern 210 as in FIG. 4B. The first and second switching devices 410 and 420 may be provided in the closed state as in FIGS. 1A and 1B. The first and second test pads TP1 and TP2 may be electrically connected to the circuit pattern 210. The electrical characteristic evaluation of the semiconductor chip 200 in FIGS. 2A to 2C may be performed by using the first and second switching devices 410 and 420 closed.

Referring FIG. 5B together with FIG. 3C, after the electrical characteristic evaluation of the semiconductor chip 200 is completed, the first switching device 410 may be opened. Accordingly, the first test pad TP1 may be electrically disconnected from the circuit pattern 210. The second switching device 420 may be closed or opened, and then the second test pad TP2 may be electrically connected to or disconnected from the circuit pattern 210.

Hereinafter, description is provided about the electrical connection of the semiconductor chip in the manufacturing process of the semiconductor chip according to another example embodiment of the inventive concepts with reference to FIGS. 4A and 5A together with FIGS. 1A to 3C. The description overlapping with the above description is omitted.

Referring to FIGS. 4B and 5A together with FIG. 5B, differently from the description in relation to FIGS. 1A and 1B, the semiconductor chip 200 may be provided in a state where the first and second test pads TP1 and TP2 are disconnected from the circuit pattern 210. For example, the first and second switching devices 410 and 420 may be in an open state. The reliability evaluation test (e.g., the THB test) of the semiconductor chip 200 may be performed in a state where the first and second test pads TP1 and TP2 are electrically disconnected from the circuit pattern 210. Accordingly, the first and second test pads TP1 and TP2 may not be damaged in the reliability evaluation process of the semiconductor chip 200. For example, the first and second test pads TP1 and TP2 may not be corroded.

Referring to FIGS. 4B, 5A and 5C together with FIG. 2B, the electrical characteristics of the semiconductor chip 200 may be evaluated in a state where the first and second test pads TP1 and TP2 are electrically connected to the circuit pattern 210. For example, before the electrical characteristic evaluation of the semiconductor chip 200, the first and second switching devices 410 and 420 may be closed. The electrical characteristic evaluation of the semiconductor chip 200 may be performed as described in relation to the example of FIG. 2B. For example, the electrical characteristic evaluation of the semiconductor chip 200 may be performed by measuring the first and second test voltages applied to the first and second test pads TP1 and TP2. At this point, a voltage applied to the first test pad TP1 is higher than those applied to the connection pads CP, and a voltage applied to the second test pad TP2 may be lower than those applied to the connection pads CP.

Referring FIGS. 4B, 5A and 5B together with FIG. 3C, after the electrical characteristic evaluation of the semiconductor chip 200, the first switching device 410 may be opened. Accordingly, the first test pad TP1 may be electrically disconnected from the circuit pattern 210. The second switching device 420 may be closed or opened, so that the second test pad TP2 may be electrically connected to or disconnected from the circuit pattern 210.

Hereinafter, the manufacturing method of the semiconductor package is continuously described.

Figure 6A:
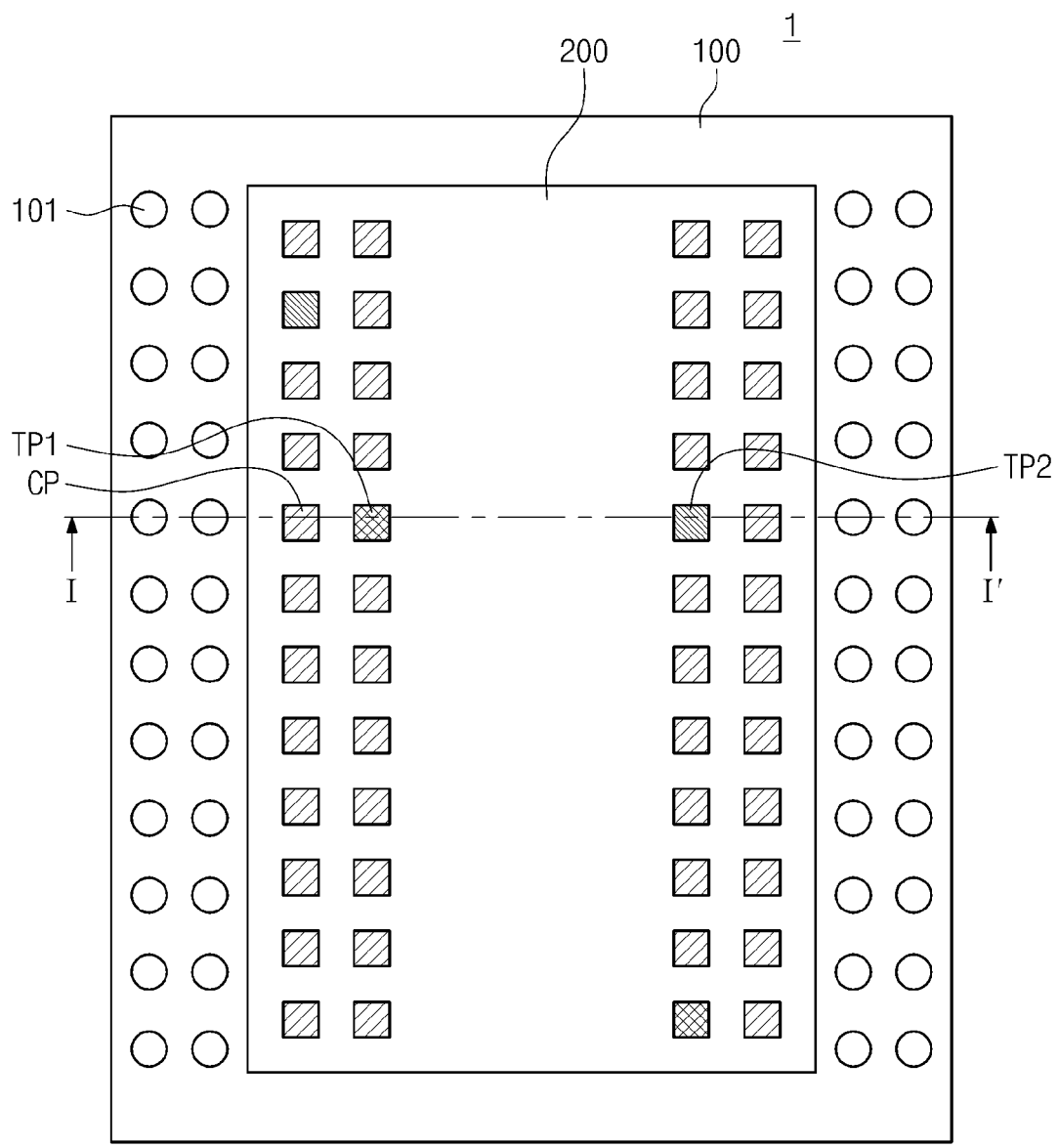
Figure 6B:
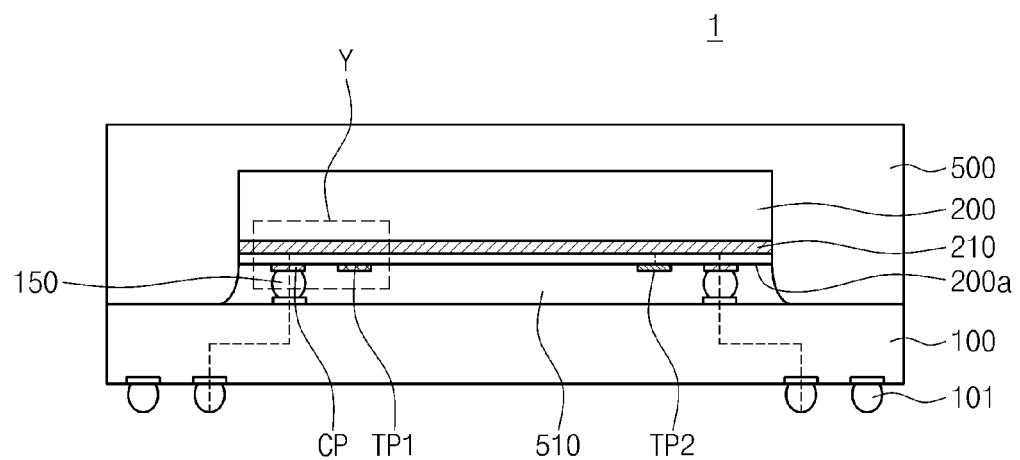
Figure 6C:
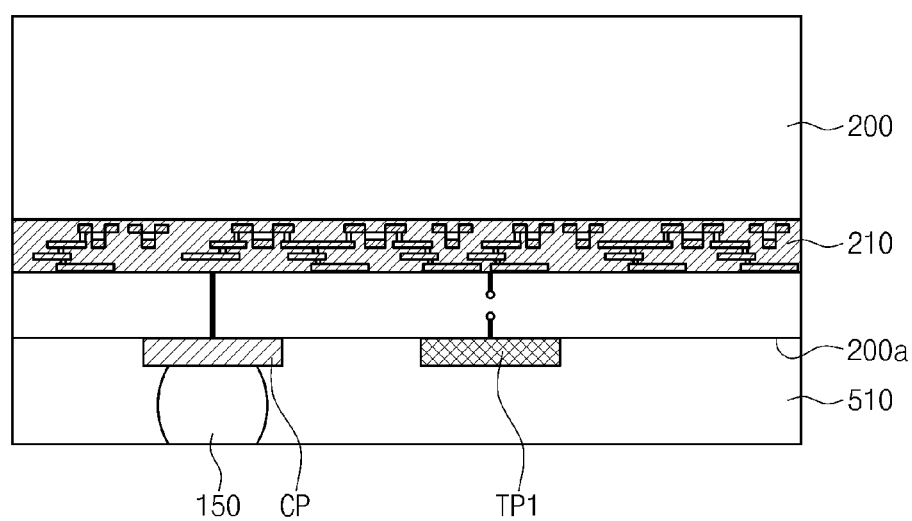

Referring to FIGS. 6A to 6C, the semiconductor chip 200 may be mounted on a substrate 100 by a flip-chip scheme. As an example, the semiconductor chip 200 may be disposed on the substrate 100 to allow the connection pads CP of the semiconductor chip 200 to face the substrate 100. The substrate 100 may be, but is not limited to, a printed circuit board (PCB). The semiconductor chip 200 may be a semiconductor chip manufactured as in the examples in FIGS. 1A to 3C. As another example, the electrical disconnection of the first test pad TP1 illustrated in relation to FIGS. 3A and 3B may be performed after the semiconductor chip 200 is mounted. Connection units 150 may be formed between the substrate 100 and the semiconductor chip 200 to electrically connect the semiconductor chip 200 to the substrate 100. The connection units 150 may be connected to the connection pads CP but may not be connected to the first and second test pads TP1 and TP2. The connection units 150 may include a power supply connection unit, a ground connection unit, and a signal delivery connection unit. The connection units 150 may include a conductive material such as metal. The connection units 150 may have a shape of a solder, a bump, or a pillar. External terminals 101 may be disposed on a bottom surface of the substrate 100. The external terminals 101 may include a conductive material such as metal. The external terminals 101 may receive input/output signals and voltages from an external device (not shown).

As illustrated with a dotted line in FIG. 6B, the circuit pattern 210 may be electrically connected to the external terminals 101 of the substrate 100 through the connection pads CP and the connection units 150. When input/output signals or voltages are applied to the external terminals 101, the input/output signals or voltages may be delivered to the circuit pattern 210 of the semiconductor chip 200 through the substrate 100 and the connection pads CP. As the first test pad TP1 is disconnected from the circuit pattern 210, the first test pad TP1 may not receive a voltage from the circuit pattern 210.

An underfill film 510 may be provided between the substrate 100 and the semiconductor chip 200 to fill up between the connection units 150. In this case, the underfill film 510 may be provided between the substrate 100 and the second test pad TP2, and between the substrate 100 and the first test pad TP1. The underfill film 510 may include an insulating polymer. A molding film 500 may cover the semiconductor chip 200 on the substrate 100. The molding film 500 may include an insulating polymer such as an epoxy-based molding compound (EMC). As another example, the underfill film 510 may be omitted, and the molding film 500 may be further extended between the substrate 100 and the semiconductor chip 200. Accordingly, a semiconductor package 1 may be manufactured.

Figure 6D:
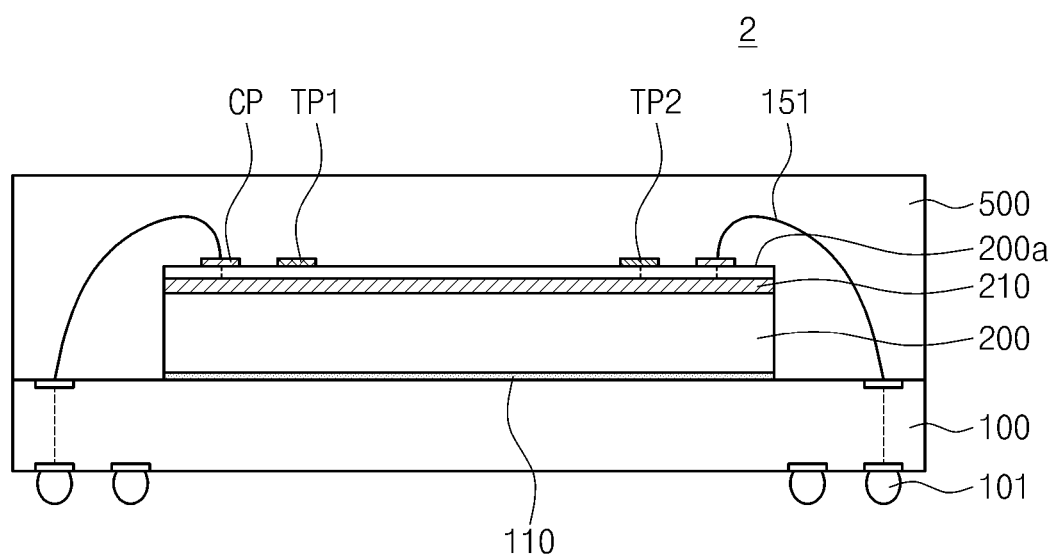
FIG. 6D illustrates a semiconductor package manufactured according to another example, and is a cross-sectional view taken along line A-B in FIG. 6A.

FIG. 6D illustrates a semiconductor package manufactured according to another example, and is a cross-sectional view taken along line A-B in FIG. 6A.

Referring to FIG. 6D together with FIG. 6A, a semiconductor chip 200 may be mounted on a substrate 100 by a wire bonding method. The semiconductor chip 200 may be the semiconductor chip 200 manufactured as illustrated in relation to FIGS. 1A to 3C. For example, after the electrical characteristics of the semiconductor chip 200 are evaluated, the first test pad TP1 may be disconnected from the circuit pattern 210. The first test pad TP1 may be electrically disconnected from the circuit pattern 210 by the fuse 400 in FIG. 4A or the first switching device 410 in FIG. 4B. The connection pads CP may be electrically connected to the circuit pattern 210. The second test pad TP2 may be electrically connected to the circuit pattern 210 as illustrated in relation to FIGS. 3A and 3B. As another example, the second test pad TP2 may be electrically disconnected from the circuit pattern 210 by the second switching device 420 in FIG. 5A.

The connection pads CP, the first test pad TP1, and the second test pad TP2 may be disposed on the one surface 200a of the semiconductor chip 200. The one surface 200a may correspond to the top surface of the semiconductor chip 200. The connection units 151 may be formed on the substrate 100 to electrically connect the connection pads CP to the substrate 100. The connection units 151 may be bonding wires. The connection units 151 may not be connected to the first and second test pads TP1 and TP2. An adhesive layer 110 may be further interposed between the substrate 100 and the semiconductor chip 200. A molding film 500 may be formed on the substrate 100 to cover the semiconductor chip 200. Accordingly, a semiconductor package 2 may be manufactured.

Description is provided about an operation of a semiconductor package manufactured according to an example embodiment of the inventive concepts. The description overlapping with the above description is omitted.

Referring to FIGS. 6A to 6D again, voltages are applied to the external terminals 101, and the semiconductor chip 200 and the semiconductor packages 1 and 2 may operate. At this point, the applied voltages may be DC bias voltages. The voltages applied to the external terminals 101 may be delivered to the semiconductor chip 200 through the connection units 150. For example, the voltages may be applied to the connection pads CP and the circuit pattern 210.

Figure 7A:
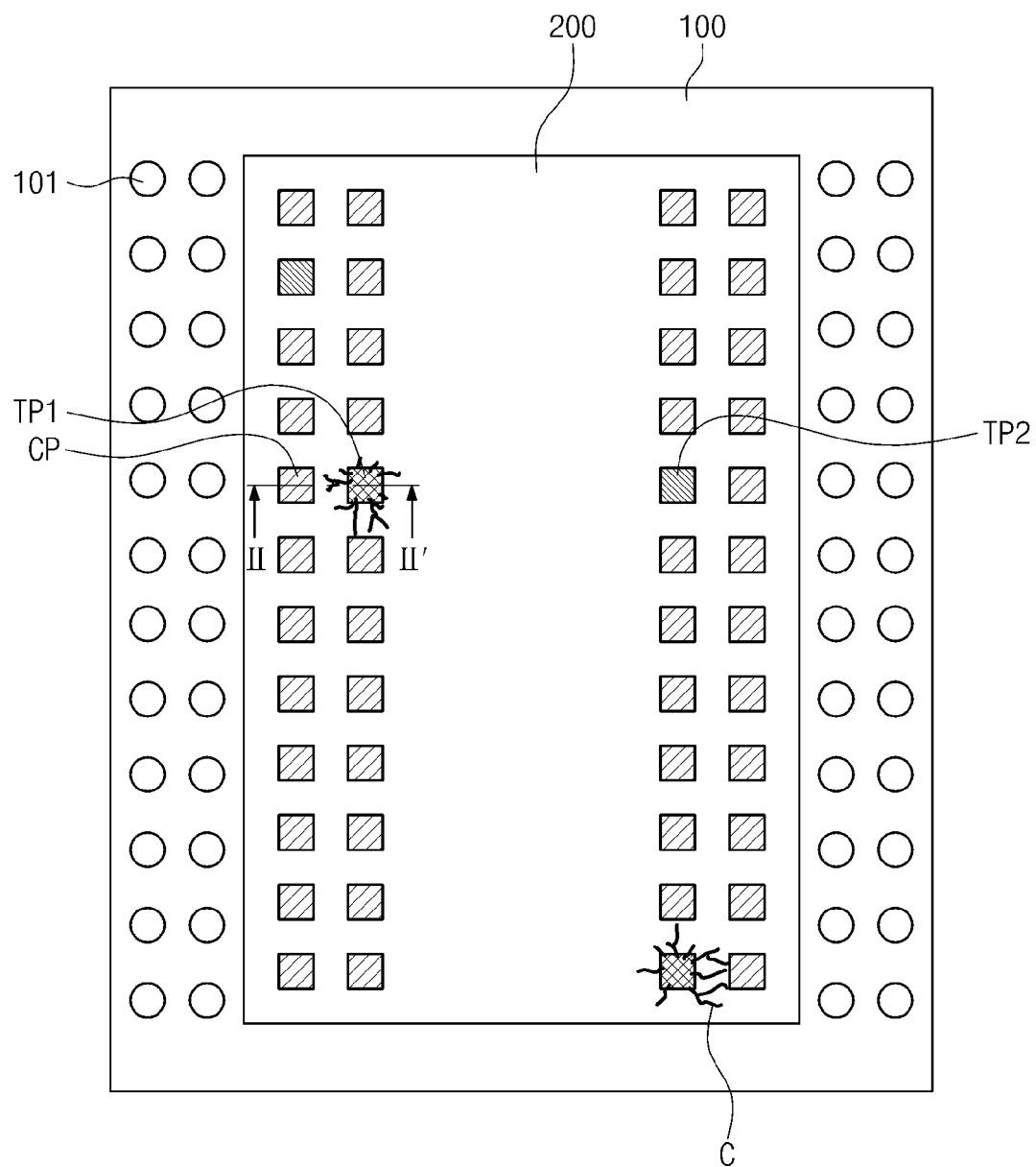
FIG. 7A is a plan view illustrating a semiconductor package according to an example embodiment of the inventive concepts.
Figure 7B:
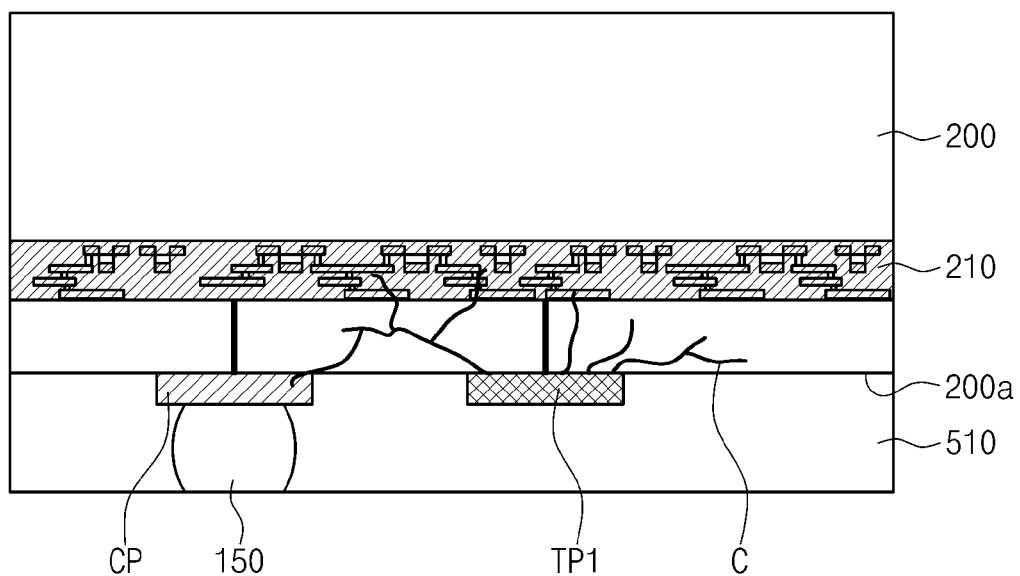
FIG. 7B is a cross-sectional view taken along line C-D in FIG. 7A.

FIG. 7A is a plan view illustrating a semiconductor package according to an example embodiment of the inventive concepts, and FIG. 7B is a cross-sectional view taken along line C-D in FIG. 7A.

Referring to FIGS. 7A and 7B together with FIG. 6B, the voltages applied to the external terminals 101 of the substrate 100 may be delivered to the semiconductor chip 200 through the connection units 150. For example, the voltages may be applied to the connection pads CP and the circuit pattern 210. When the first test pads TP1 are electrically connected to the circuit pattern 210, the voltage applied to the semiconductor chip 200 may be delivered to the first test pads TP1 through the circuit pattern 210. The voltages applied to the connection pads CP, the first test pads TP1, and the second test pads TP2 may be different from each other. The voltages applied to the connection pads CP may be different from each other. In operation of the semiconductor package, the voltages applied to the pads CP, TP1, and TP2 may correspond to voltages applied to the respective pads CP, TP1 and TP2 in the electrical characteristic evaluation process of the semiconductor chip 200 described in relation to FIGS. 2A to 2C. For example, the voltage applied to the first test pads TP1 may be higher than those applied to the connection pads CP. In detail, the voltage applied to the first test pads TP1 may be higher than a maximum value of the voltages applied to the connection pads CP. At least one of the substrate 100, the underfill film 510, and the molding film 500 may include negative ions such as chloride ions. When an operation of the semiconductor package is continued, the negative ions included in the substrate 100, the underfill film 510, or the molding film 500 may be activated and moved. The negative ions may move towards a position to which a high voltage is applied. As the voltage applied to the first test pads TP1 is higher than those applied to the connection pads CP, the negative ions included in the substrate 100, the underfill film 510, or the molding film 500 may move towards the first test pads TP1.

A metal (e.g., aluminum) included in the first test pads TP1 may react with the negative ions (e.g., chloride ions), which results in corrosion of the first test pads TP1. Due to the corrosion of the first test pads TP1, volumes of the first test pads TP1 may be changed. Accordingly, cracks C may be formed in the first test pads TP1. The cracks C may occur in a portion adjacent to the first test pads TP1. The cracks C may damage the circuit pattern 210 or the connection pads CP adjacent to the first test pads TP1.

Referring to FIGS. 6A to 6C again, the first test pad TP1 may be electrically disconnected from the circuit pattern 210. Accordingly, the voltages input from the external terminals 101 may be delivered to the connection pad CP and the circuit pattern 210, but may not be delivered to the first test pad TP1. Accordingly, even though the operation of the semiconductor package 1 is continued, the negative ions may not move towards the first test pad TP1. According to an embodiment, when the operation of the semiconductor package 1 is continued, the first test pad TP1 may not be corroded.

As an example, the second test pad TP2 may be electrically disconnected to the circuit pattern 210. In an operation of the semiconductor package 1, a voltage may not be applied to the second test pad TP2 and the second test pad TP2 may not be corroded.

As another example, the second test pad TP2 may be electrically connected to the circuit pattern 210 and a voltage may be applied to the second test pad TP2 in the operation of the semiconductor package 1. The voltage delivered to the second test pad TP2 may be lower than those applied to the connection pads CP. Even though the voltage is applied to the second test pad TP2, the negative ions may not be concentrated on the second test pad TP2. When the operation of the semiconductor package 1 is continued, the second test pad TP2 may not be corroded by the negative ions.

The voltages applied to the connection pads CP may be higher than that applied to the second test pad TP2. The total number of the connection pads CP may be greater than a sum of the numbers of the first and second test pads TP1 and TP2. As the connection pads are provided in plurality, the negative ions may not be concentrated on any one of the connection pads CP. For example, the negative ions may be dispersed to move towards each of the connection pads CP. An amount of the negative ions moved towards any one of the connection pads CP may not be enough to cause corrosion or cracks C to the connection pads. According to an embodiment, as the first test pad TP1 is electrically disconnected from the circuit pattern 210, the connection pads CP, the first and second test pads TP1 and TP2 may not be corroded. Accordingly, reliability of the semiconductor chips can be improved.

Application Example

Figure 8A:
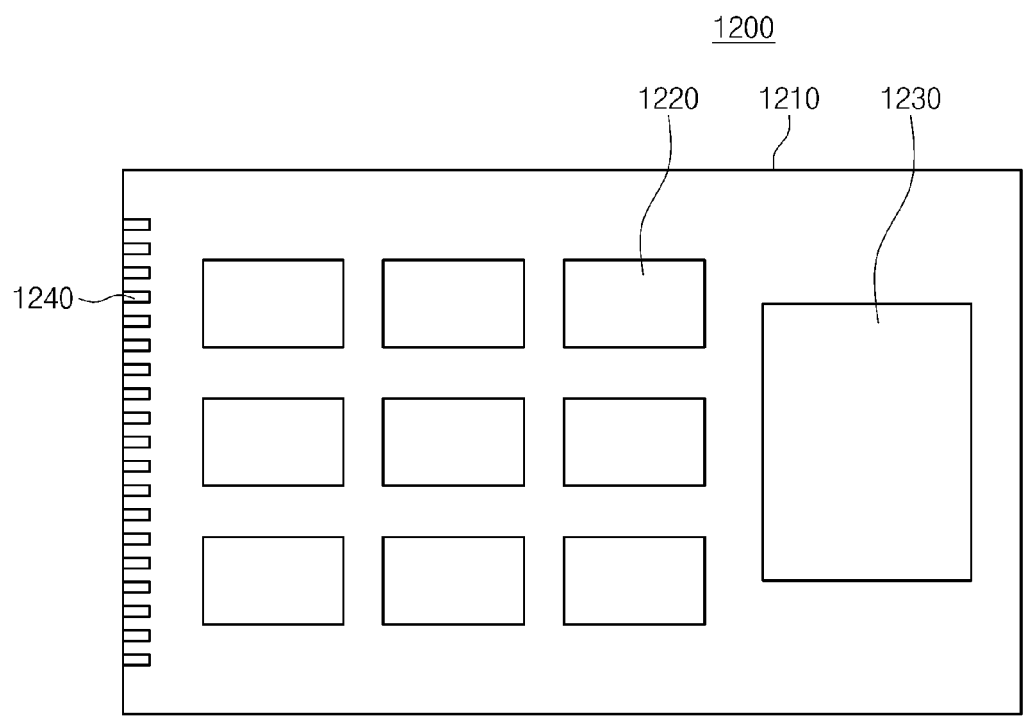
FIG. 8A illustrates an example package module including a semiconductor package according to an example embodiment of the inventive concepts.
Figure 8B:
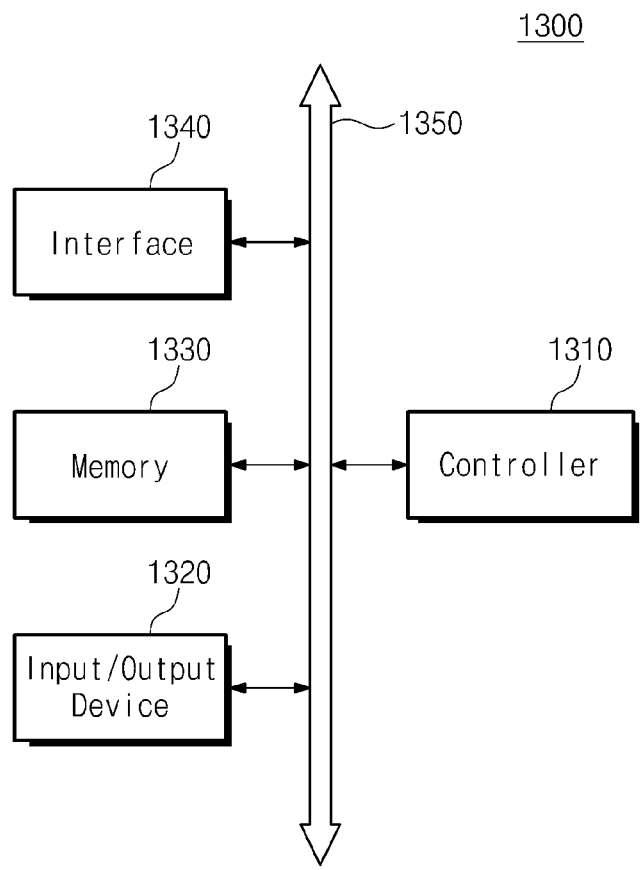
FIG. 8B illustrates an example block diagram of an electronic system including a semiconductor package according to an example embodiment of the inventive concepts.
Figure 8C:
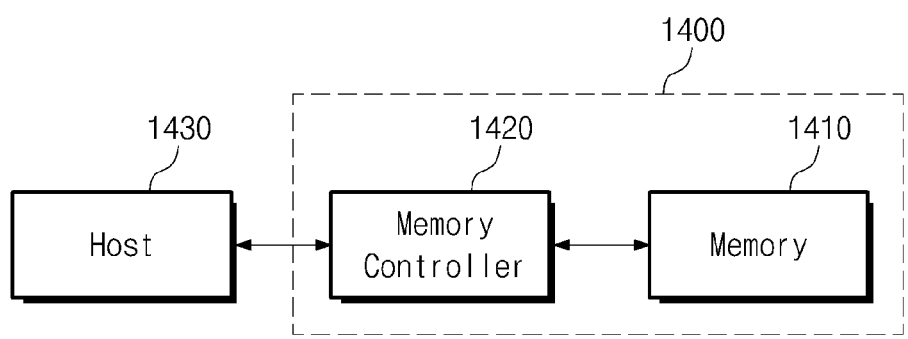
FIG. 8C illustrates an example block diagram of a memory card including a semiconductor package according to an example embodiment of the inventive concepts.

FIG. 8A illustrates an example package module including a semiconductor package according to an example embodiment of the inventive concepts. FIG. 8B illustrates an example block diagram of an electronic system including a semiconductor package according to an example embodiment of the inventive concepts. FIG. 8C illustrates an example block diagram of a memory card including a semiconductor package according to an example embodiment of the inventive concepts.

Referring FIG. 8A, a package module 1200 may be provided in a type such as a semiconductor integrated circuit chip 1220 and a quad flat packaged (QFP) semiconductor integrated circuit chip 1230. The semiconductor devices 1220 and 1230 may include at least any one of the semiconductor packages 1 and 2 according to example embodiments of the inventive concepts. The package module 1200 may be connected to an external electronic device through external connection terminals 1240 disposed on one side of a substrate 1210.

Referring to FIG. 8B, an electronic system 1300 may include a controller 1310, an input/output device 1320, and a memory device 1330. The controller 1310, the input/output device 1320, and the memory device 1330 may be combined through a bus 1350. The bus 1350 may be referred to as a passage through which data is delivered. For example, the controller 1310 may include at least any one selected from at least one microprocessor, a digital signal processor, a microcontroller, and logic devices capable of performing the same functions as them. The controller 1310 and the memory device 1330 may include at least any one of the semiconductor packages 1 and 2 according to example embodiments of the inventive concepts. The input/output device 1320 may include at least any one selected from a keypad, a keyboard, and a display device. The memory device 1330 is a device that stores data.

The memory device 1330 may store data and/or instructions executed by the controller 1310. The memory device 1330 may include a volatile memory device and/or a nonvolatile memory device. Alternatively, the memory device 1330 may be formed of a flash memory.

For example, a flash memory to which a technique according to an example embodiment of the inventive concepts is applied may be mounted on an information processing system such as a mobile device or a desk top computer. Such a flash memory may be configured from a semiconductor disk device (SSD). In this case, the electronic system 1300 may further include an interface 1340 for transmitting data to a communication network or receiving data from the communication network.

The interface 1340 may be a wired or wireless type. For example, the interface 1340 may include an antenna or a wired or wireless transceiver, etc. In addition, although not shown in the drawing, it is obvious to those skilled in the art that an Application chipset, a camera image processor, and an input/output device may be further provided to the electronic system 1300

The electronic system 1300 may be implemented with a mobile system, a personal computer, an industrial computer, or a logic system performing various functions. For example, the mobile system may be any one selected from a personal digital assistant (PDA), a portable computer, a web tablet, a mobile phone, a wireless phone, a laptop computer, a memory card, a digital music system, and an information transmission/reception system. When the electronic system 1300 is an equipment capable of performing wireless communication, the electronic system 1300 may be used in a communication interface protocol like a 3-rd generation communication system including CDMA, GSM, NADC, E-TDMA, WCDAM, and CDMA2000.

Referring FIG. 8C, the memory card 1400 may include a nonvolatile memory device 1410 and a memory controller 1420. The nonvolatile memory device 1410 and the memory controller 1420 may store data or read the stored data. The nonvolatile memory device 1410 may include at least any one of the semiconductor packages 1 and 2 according to example embodiments of the inventive concepts. The memory controller 1420 may control the nonvolatile memory device 1410 so that stored data is read or data is stored in response to a read/write request by a host 1430.

According to an example embodiment of the inventive concepts, first test pads can be electrically disconnected from a circuit pattern. When the first test pads are electrically connected to the circuit pattern, a higher voltage can be applied to the first test pads than to the connection pads. When operating the semiconductor package, negative ions included in the semiconductor package can move towards a position where a higher voltage is applied. According to example embodiments of the inventive concepts, a voltage input from external terminals may not be delivered to the first test pads. Even though the operation of the semiconductor package is continued, the first test pads may not be corroded.

Voltages applied to the connection pads may be higher than that applied to second test pads. The total number of the connection pads may be greater than a sum of the numbers of the first and second test pads. As the connection pads are provided in plurality, the negative ions may not be concentrated on any one of the connection pads. An amount of the negative ions moved towards any one of the connection pads may not be enough to cause corrosion or cracks to the connection pads. Accordingly, reliability of the semiconductor chips can be improved.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of manufacturing a semiconductor package, the method comprising:
   providing a semiconductor chip including a circuit pattern, a connection pad, a first test pad, a second test pad, a first switching device between the circuit pattern and the first test pad, and a second switching device between the circuit pattern and the second test pad, each of the connection pad, the first test pad and the second test pad respectively electrically connected to the circuit pattern;
   evaluating reliability of the semiconductor chip when the first and second test pads are electrically disconnected from the circuit pattern;
   after the evaluating reliability of the semiconductor chip, evaluating electrical characteristics of the semiconductor chip by applying a first test voltage to the first test pad and a second test voltage to the second test pad;
   after the evaluating electrical characteristics of the semiconductor chip, electrically disconnecting the first test pad from the circuit pattern using the first switching device; and
   mounting the semiconductor chip on a substrate electrically connected to the connection pad and electrically disconnected from the first test pad and the second test pad.

2. The method of claim 1, further comprising:
   electrically connecting the first and second test pads to the circuit pattern using the first and second switching devices before the evaluating electrical characteristics of the semiconductor chip,
   wherein the electrically connecting electrically connects the first and second test pads to the circuit pattern after the evaluating reliability of the semiconductor chip.

* * * * *